United States Patent
Dey et al.

(10) Patent No.: US 11,422,581 B2
(45) Date of Patent: Aug. 23, 2022

(54) DYNAMIC BIASING TECHNIQUES

(71) Applicant: Arm Limited, Cambridge (GB)

(72) Inventors: Ranabir Dey, Bangalore (IN); Vijaya Kumar Vinukonda, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/000,141

(22) Filed: Aug. 21, 2020

(65) Prior Publication Data
US 2022/0057824 A1 Feb. 24, 2022

(51) Int. Cl.
*H03K 3/023* (2006.01)
*G05F 3/20* (2006.01)
*H03K 3/0233* (2006.01)
*H03K 3/356* (2006.01)
*G05F 3/30* (2006.01)

(52) U.S. Cl.
CPC ............... *G05F 3/205* (2013.01); *G05F 3/30* (2013.01); *H03K 3/02335* (2013.01); *H03K 3/356104* (2013.01)

(58) Field of Classification Search
CPC ........................ H03K 19/0175–017527; H03K 19/0185–01855
See application file for complete search history.

(56) References Cited

U.S. PATENT DOCUMENTS

| | | | |
|---|---|---|---|
| 7,397,279 B2* | 7/2008 | Bhattacharya | ............................... H03K 19/017509 326/63 |
| 8,531,227 B2* | 9/2013 | Kumar | ........... H03K 19/018528 327/333 |
| 9,966,955 B2* | 5/2018 | Dey | ............... H03K 19/017509 |
| 10,637,446 B1* | 4/2020 | Mathur | .................... G05F 1/575 |
| 10,804,884 B1* | 10/2020 | Tsai | ................. H03K 19/00315 |
| 2014/0002146 A1* | 1/2014 | Kim | ..................... H03K 17/102 327/109 |
| 2016/0036441 A1* | 2/2016 | Dey | ................... H03K 3/35613 326/63 |
| 2021/0226630 A1* | 7/2021 | Sanchez | ........... H03K 19/00384 |

\* cited by examiner

*Primary Examiner* — Thomas J. Hiltunen
(74) *Attorney, Agent, or Firm* — Pramudji Law Group PLLC; Ari Pramudji

(57) ABSTRACT

Various implementations described herein are related to a device having header circuitry with first transistors that are configured to receive a supply voltage and provide a dynamically biased voltage. The device may include reference generation circuitry having multiple amplifiers that are configured to receive the supply voltage and provide reference voltages based on the supply voltage. The device may include bias generation circuitry having second transistors configured to track changes in the dynamically biased voltage and adjust the dynamically biased voltage by generating bias voltages based on the reference voltages and by applying the bias voltages to the header circuitry so as to adjust the dynamically biased voltage.

19 Claims, 11 Drawing Sheets

500

Pre-Driver Circuitry 118 ns is US 11,422,581 B2

DYNAMIC BIASING TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Due to technological scaling down in some conventional designs, the maximum operating voltage that a device can withstand is also scaling down. As such, some input-output (IO) devices cannot withstand higher operating voltages and are thus deficient and relatively inadequate for modern use. Hence, there exists a need to improve conventional circuit designs that can withstand higher operating voltages.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
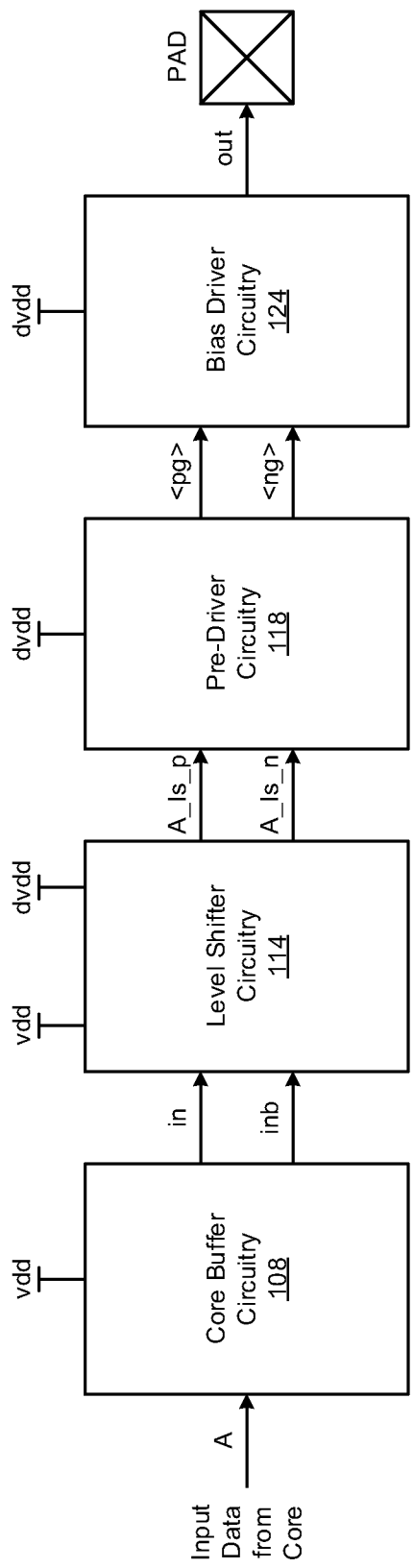
FIG. 1 illustrates a diagram of overdrive input-output (IO) transmitter (Tx) circuitry in accordance with various implementations described herein.
Figure 1:
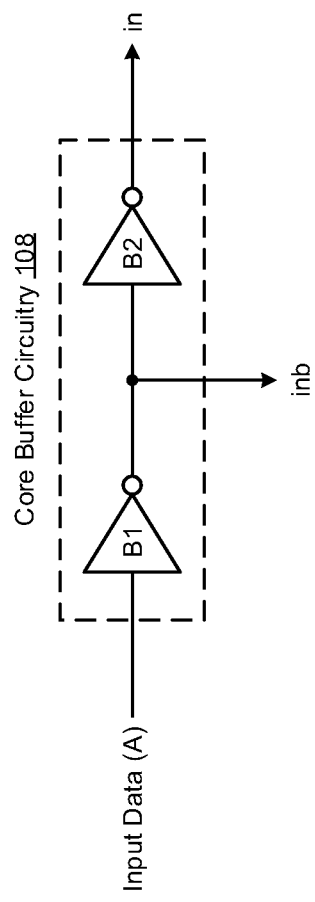

Various implementations described herein refer to dynamic biasing schemes and techniques for various voltage biasing applications. The dynamic biasing schemes and techniques may refer to various voltage difference control schemes and techniques across the terminals of various devices. For instance, various schemes and techniques described herein may provide for overdrive input-output (IO) transmitter (Tx) circuitry that operates in multiple different voltage domains within voltage level ranges between 1.8V and 3.3V. In some implementations, the overdrive IO circuitry may operate at a frequency of 150 MHz in a 3.3V domain and at 125 MHz in an 2.5V domain and also at 200 MHz in a 1.8V domain.

The various schemes and techniques described herein may provide for biasing circuitry that is enhanced so that there is no stress on the circuit design. Also, the biasing circuitry may be enhanced for operation in a 1.8V domain without any DC leakage current from reference signals (e.g., REFN to REFP signals). This biasing signal may be used in a driver as well as a level shifter to ensure reliability, and the level shifter timing behavior may be impacted with stacked transistors. Also, in some instances, a boosting circuit may be used to enhance the timing behavior at a maximum frequency of 150 MHz.

In some implementations, various schemes and techniques described herein may provide for output circuitry having boost logic, header logic, reference logic, and bias logic. The boost logic may be configured to provide boost voltages based on boost control signals. The header logic may be configured to derive a dynamically biased voltage from a supply voltage and the boost voltages. The reference logic may be configured to derive reference voltages from the supply voltage. Also, the bias logic may be configured to track voltage changes in the dynamically biased voltage, generate bias voltages based on the reference voltages, and apply the bias voltages to the header logic so as to adjust the dynamically biased voltage. The bias logic may be configured to provide the bias voltages so as to thereby avoid stress or reliability issues related to any transistors in the output circuit. The output circuitry may refer to a level shifter that operates within a multi-voltage range associated with different voltage levels related to one or more of 1.8V, 2.5V and 3.3V. The reference logic may have buffered bandgap logic that is configured to derive a bandgap voltage based on the supply voltage. The reference logic may have a first amplifier configured to derive a first reference voltage of the reference voltages from the bandgap voltage, and the reference logic may have a second amplifier configured to derive a second reference voltage of the reference voltages from the supply voltage and the first reference voltage. Also, the bias logic may be configured to derive stack-bias voltages from the dynamically biased voltage and the reference voltages, and also, the bias logic may be configured to generate bias voltages based on the reference voltages and the stack-bias voltages, and also, in some instances, based on generation of bias voltages for drivers.

Various implementations of dynamic biasing schemes and techniques will be described in greater detail herein with reference to FIGS. 1-8.

FIG. 1 illustrates a diagram 100 of overdrive input-output (IO) circuitry 104 in accordance with various implementations described herein. In various implementations, the overdrive IO circuitry 104 may refer to overdrive IO transmitter (Tx) circuitry.

In various implementations, the overdrive IO circuitry 104 may be implemented as a system or device having various integrated circuit (IC) components that are arranged and coupled together as an assemblage or combination of parts that provide for a physical circuit design and related structures. In some instances, a method of designing, providing and building the overdrive IO circuitry 104 as an integrated system or device may involve use of various IC circuit components described herein so as to implement various dynamic biasing schemes and techniques associated therewith. Also, the overdrive IO circuitry 104 may be integrated with computing circuitry and related components on a single chip, and the overdrive IO circuitry 104 may be implemented within various embedded systems for automotive, electronic, mobile, server and Internet-of-things (IoT) applications.

As shown in FIG. 1, the overdrive IO transmitter (Tx) circuitry 104 may include various circuitry including, e.g., core buffer circuitry 108, level shifter circuitry 114, pre-driver circuitry 118 and bias driver circuitry 124. In some instances, the various circuitry 108, 114, 118, 124 may be coupled together to receive input data at an input node (A) and provide output data (out) to an output pad (PAD). The input data (A) may be received from core circuitry, such as, e.g., a core processor or similar component. Also, the various circuitry 108, 114, 118, 124 may operate in one or multiple voltage domains, such as, e.g., a core supply voltage domain (vdd) and/or a I/O supply voltage domain (dvdd).

The core buffer circuitry 108 may be configured to receive the input data from the core at node (A) and provide complementary output signals (in, inb). The core buffer circuitry 108 may be coupled to a first supply voltage (vdd), such as, e.g., the core supply voltage domain (vdd). In some instances, as shown in FIG. 1, the core buffer circuitry 108 may include logic, such as, e.g., one or more buffers (B1, B2) that are arranged and configured to receive the input data at node (A) and provide complementary output signals (in, inb). For instance, the buffers (B1, B2) may be implemented with a first inverter (B1) and a second inverter (B2), wherein the first inverter (B1) receives the input data at node (A) and provides a first output signal (inb), and wherein the second inverter (B2) receives the first output signal (inb) and provides a second output signal (in).

The level shifter circuitry 114 may be coupled between the core buffer circuitry 108 and the pre-driver circuitry 118. The level shifter circuitry 114 may be configured to receive the signals (in, inb) from the core buffer circuitry 108 and provide complementary output signals (A_Is_p, A_Is_n) to the pre-driver circuitry 118. The level shifter circuitry 114 may be coupled to multiple supply voltages (vdd, dvdd), such as, e.g., the core supply voltage domain (vdd) and the IO supply voltage domain (dvdd). The level shifter circuitry 114 is described in greater detail herein in reference to FIGS. 2-3 and 4A-4B.

The pre-driver circuitry 118 may be coupled between the level shifter circuitry 114 and the bias driver circuitry 124. In some instances, the pre-driver circuitry 118 may be configured to receive the complementary signals (A_Is_p, A_Is_n) from the level shifter circuitry 114 as input and provide complementary output signals (<pg>, <ng>) to the bias driver circuitry 124. Also, the pre-driver circuitry 118 may be coupled to a second supply voltage (dvdd), such as, e.g., the IO supply voltage domain (dvdd). The pre-driver circuitry 118 is described in greater detail herein in reference to FIG. 5.

The bias driver circuitry 124 may be coupled between the pre-driver circuitry 118 and the output pad (PAD). In some instances, the bias driver circuitry 124 may be configured to receive the complementary signals (<pg>, <ng>) from the pre-driver circuitry 118 as input and then provide the output data signal (out) to the output pad (PAD). Also, the bias driver circuitry 124 may be coupled to the second supply voltage (dvdd), such as, e.g., the IO supply voltage domain (dvdd). Also, the bias driver circuitry 124 is described in greater detail herein in reference to FIG. 6.

Figure 2:
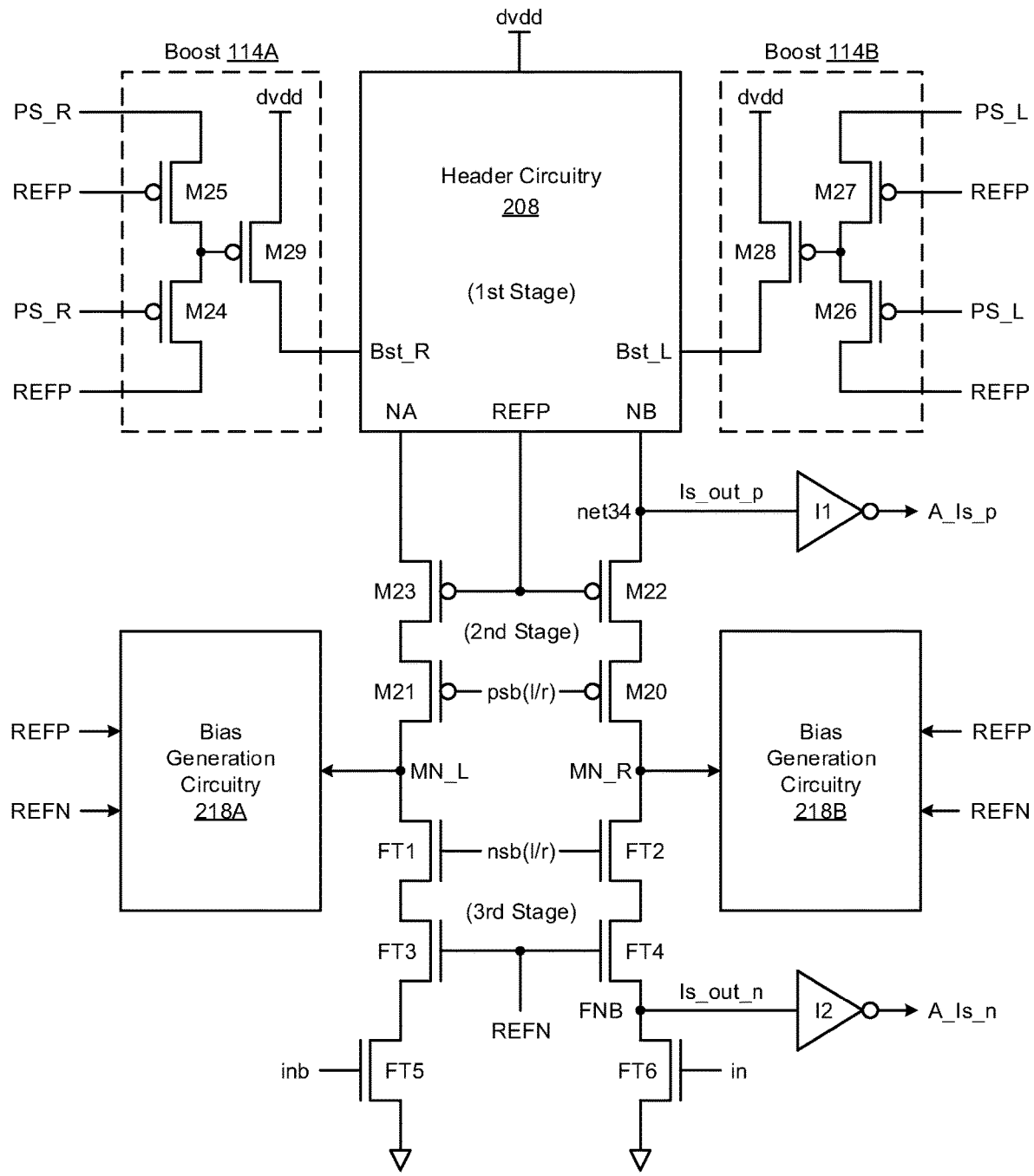
FIG. 2 illustrates a schematic diagram of level shifting circuitry in accordance with various implementations described herein.

FIG. 2 illustrates a schematic diagram 200 of the level shifting circuitry 114 in accordance with various implementations described herein. In various implementations, the level shifting circuitry 114 may be configured to operate as a level shifter within a multi-voltage range that is associated with various different voltage levels, including, e.g., the core supply voltage domain (vdd) and/or the IO supply voltage domain (dvdd) that may be associated with various supply voltage levels of 1.8V, 2.5V and 3.3V.

Figure 3:
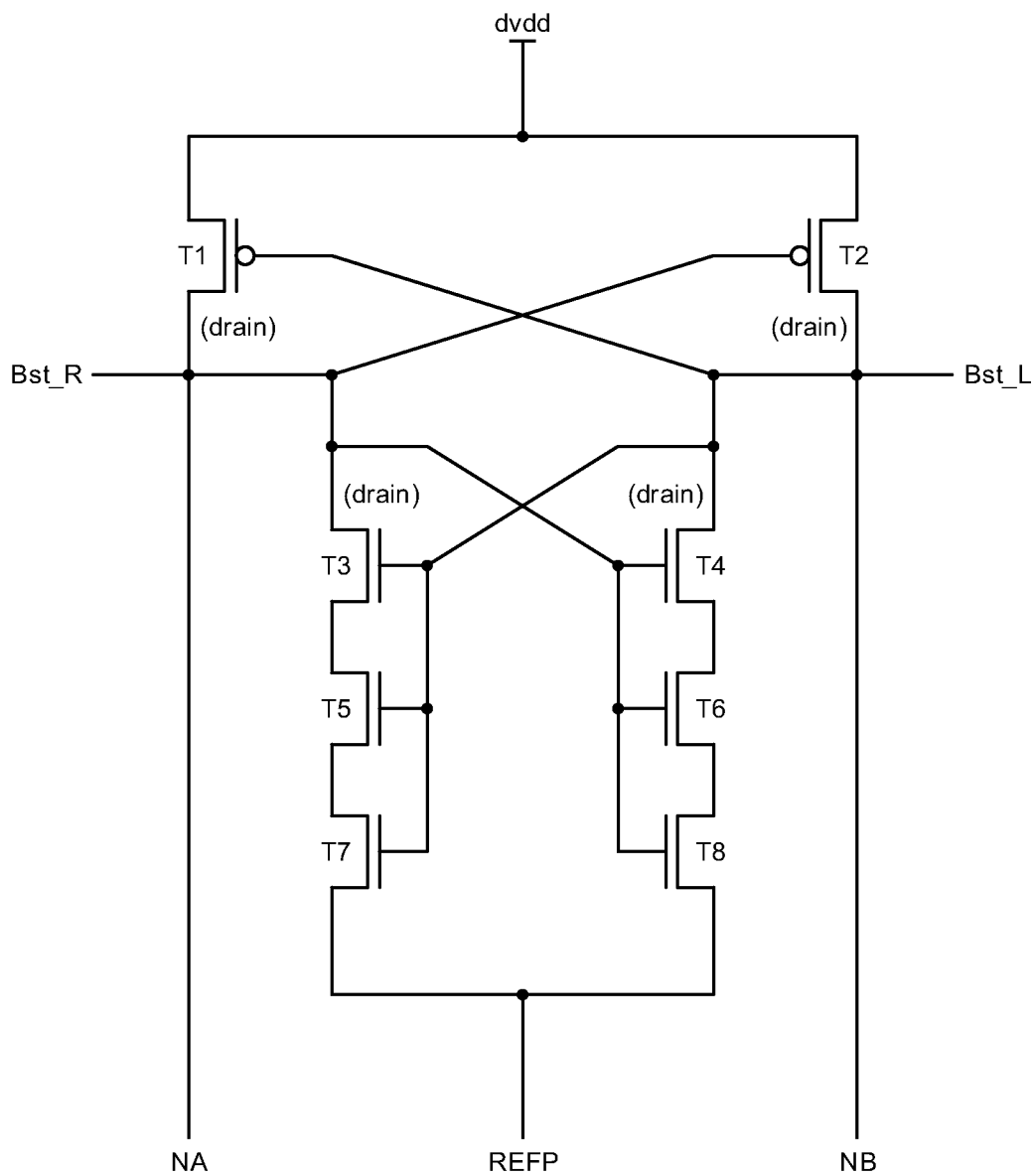
FIG. 3 illustrates a schematic diagram of header circuitry in accordance with various implementations described herein.

As shown in FIG. 2, the level shifting circuitry 114 may include header circuitry 208 having first transistors that are arranged and configured to receive a supply voltage (dvdd) and provide a dynamically biased voltage (e.g., MN_L, MN_R). In some instances, the first transistors of the header circuitry 208 may be provided in a multi-stage configuration with multiple stages, including, e.g., a first stage, a second stage, and a third stage. The first stage is also shown in FIG. 3, wherein the first stage has cross-coupled transistors coupled between the supply voltage and first stacked transistors, and the first stacked transistors are coupled to gates of the cross-coupled transistors and output nodes. The first stage may have multiple output nodes, including, e.g., a first output node (NA) and a second output node (NB), wherein the Is_out_p signal is provided to an output buffer (e.g., inverter I1)) at node (net34), and wherein the output buffer (I1) provides the output signal (A_Is_p) as an inversion of the Is_out_p signal. Also, the header circuitry 208 may be coupled to the IO supply voltage (dvdd). In various instances, the dynamically biased voltage (A_Is_p) reduces stress in the entire circuit, and in particular, the right-side of the circuit, which may provide the part of the circuit that is used to bias the driver PMOS and pre-driver for <pg> signal generations. The first stage of the header circuitry 208 is described in greater detail in reference to FIG. 3.

The second stage may have transistors (M20, M21, M22, M23) that are coupled between the first stage and intermediate nodes (MN_L, MN_R). Transistors (M21, M23) may be coupled in series between the output node (NA) of the header circuitry 208 and a first intermediate node (MN_L), and also, transistors (M20, M22) may be coupled in series between the output node (NB) of the header circuitry 208 and a second intermediate node (MN_R). The REFP signal may be coupled to gates of transistors (M22, M23), and also, p_stack_bias signal (psb(l/r)) may be coupled to gates of transistors (M20, M21). In some instances, the first intermediate node (MN_L) may provide the MN_L signal to first bias generation circuitry 218A, and also, the second intermediate node (MN_R) may provide the MN_R signal to second bias generation circuitry 218B. In some implementations, the second stage has second stacked transistors (M20, M22 and M21, M23) that are coupled between the first stage at the output nodes (NA, NB) and the bias generation circuitry 218A, 218B at the intermediate nodes (MN_L, MN_R).

The third stage may include footer transistors (FT1, FT2, FT3, FT4, FT5, FT6) that are coupled between the second stage and ground (Gnd or Vss). Transistors (FT1, FT3, FT5) may be coupled in series between the first intermediate node (MN_L) and ground (Gnd or Vss), and transistors (FT2, FT4, FT6) may be coupled in series between the second intermediate node (MN_R) and ground (Gnd or Vss). The n_stack_bias signal (nsb(l/r)) may be coupled to gates of transistors (FT1, FT2), the REFN signal may be coupled to gates of transistors (FT3, FT4), and the input signals (inb, in) may be coupled to gates of transistors (FT5, FT6), respectively. The third stage may have an output node, including, e.g., a footer output node (FNB), wherein the Is_out_n signal is provided to an output buffer (e.g., inverter (12)) at node (FNB), and wherein the output buffer (12) provides output signal (A_Is_n) as an inversion of the Is_out_n signal. In various instances, the dynamically biased voltage (A_Is_n) reduces stress in the entire circuit, and in particular, the right-side of the circuit, which may provide the part of the circuit that controls the NMOS driver side and also pre-driver for <ng> signals. Also, in some instances, the third stage has third stacked transistors (FT1, FT3, FT5 and FT2, FT4, FT6) that are coupled between the bias generation circuitry 218A, 218B, e.g., at intermediate nodes (MN_L, MN_R), and ground (Gnd or Vss).

The level shifting circuitry 114 may include boost circuitry 114A, 114B having third transistors that are configured to receive boost control signals (PS_R, PS_L), receive reference signals (REFP, REFN), generate boost voltages (Bst_R, Bst_L) based on the boost control signals (PS_R, PS_L) and the reference signals (REFP, REFN), and provide the boost voltages (Bst_R, Bst_L) to the first transistors of the header circuitry 208 based on the boost control signals (PS_R, PS_L) and reference signals (REFP, REFN). In some implementations, the boost control signals (PS_R, PS_L) may include a first boost control signal, such as, e.g., a Psteer_Left signal (PS_L) and a Psteer_right signal (PS_R). Also, the boost circuitry 114A, 114B may be coupled to the IO supply voltage (dvdd), and thus, the boost voltages (Bst_R, Bst_L) may be generated based on the boost control signals (PS_R, PS_L), reference signals (REFP, REFN), and IO supply voltage (dvdd).

In some implementations, the boost circuitry 114A, 114B may have a first boost circuit 114A and a second boost circuit 114B coupled to the header circuitry 208. The first boost circuit 114A may include transistors (M24, M25, M29) that are configured to receive multiple signals (PS_R, PS_R, REFP) and provide a first boost signal (Bst_R) to the header circuitry 208. As shown in FIG. 2, PMOS transistors (M24, M25) may be coupled in series between the PS_R signal and the REFP signal, and the REFP signal is coupled to a gate of PMOS transistor (M25), and the PS_R signal is coupled to a gate of PMOS transistor (M24), and PMOS transistor (M29) is coupled between the dvdd supply and the header circuitry 208.

In some implementations, the second boost circuit 114B may include transistors (M26, M27, M28) that are configured to receive multiple signals (PS_L, PS_L, REFP) and provide a second boost signal (Bst_L) to the header circuitry 208. As shown in FIG. 2, PMOS transistors (M26, M27) may be coupled in series between the PS_L signal and the REFP signal, and the REFP signal is coupled to a gate of PMOS transistor (M27), and the PS_L signal is coupled to a gate of PMOS transistor (M26), and PMOS transistor (M28) is coupled between the vdd supply and the header circuitry 208.

The level shifting circuitry 114 may utilize reference generation circuitry 704 (as shown in FIG. 7) having multiple amplifiers that are arranged and configured to receive the supply voltage (dvdd) and provide multiple reference voltages (REFP, REFN) based on the supply voltage (dvdd). The logic circuitry of the reference generation circuitry 704 is shown and described in greater detail herein in reference to FIG. 7.

Figure 4A:
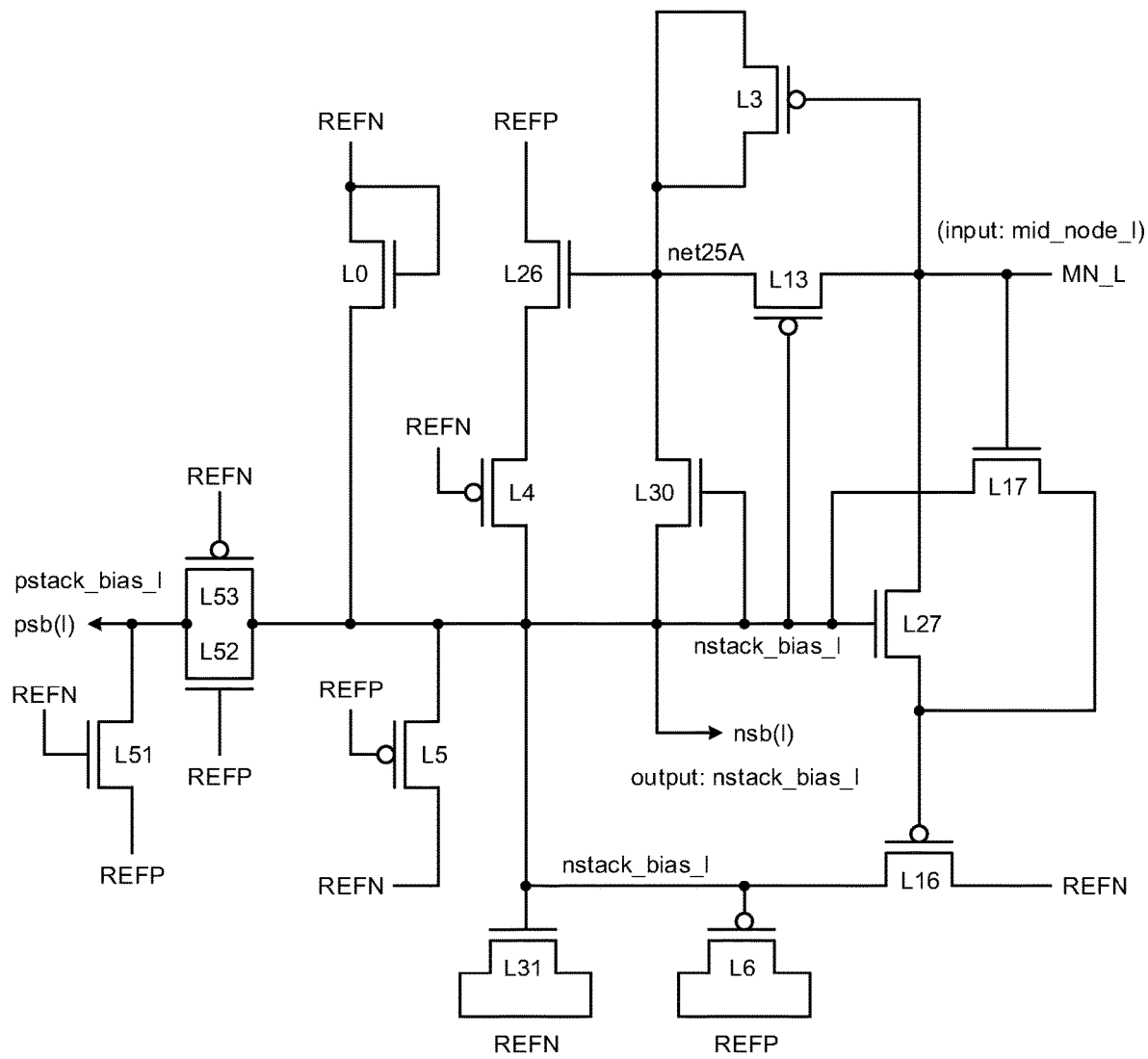
FIGS. 4A-4C illustrate various schematic diagrams of bias generation circuitry in accordance with various implementations described herein.
Figure 4B:
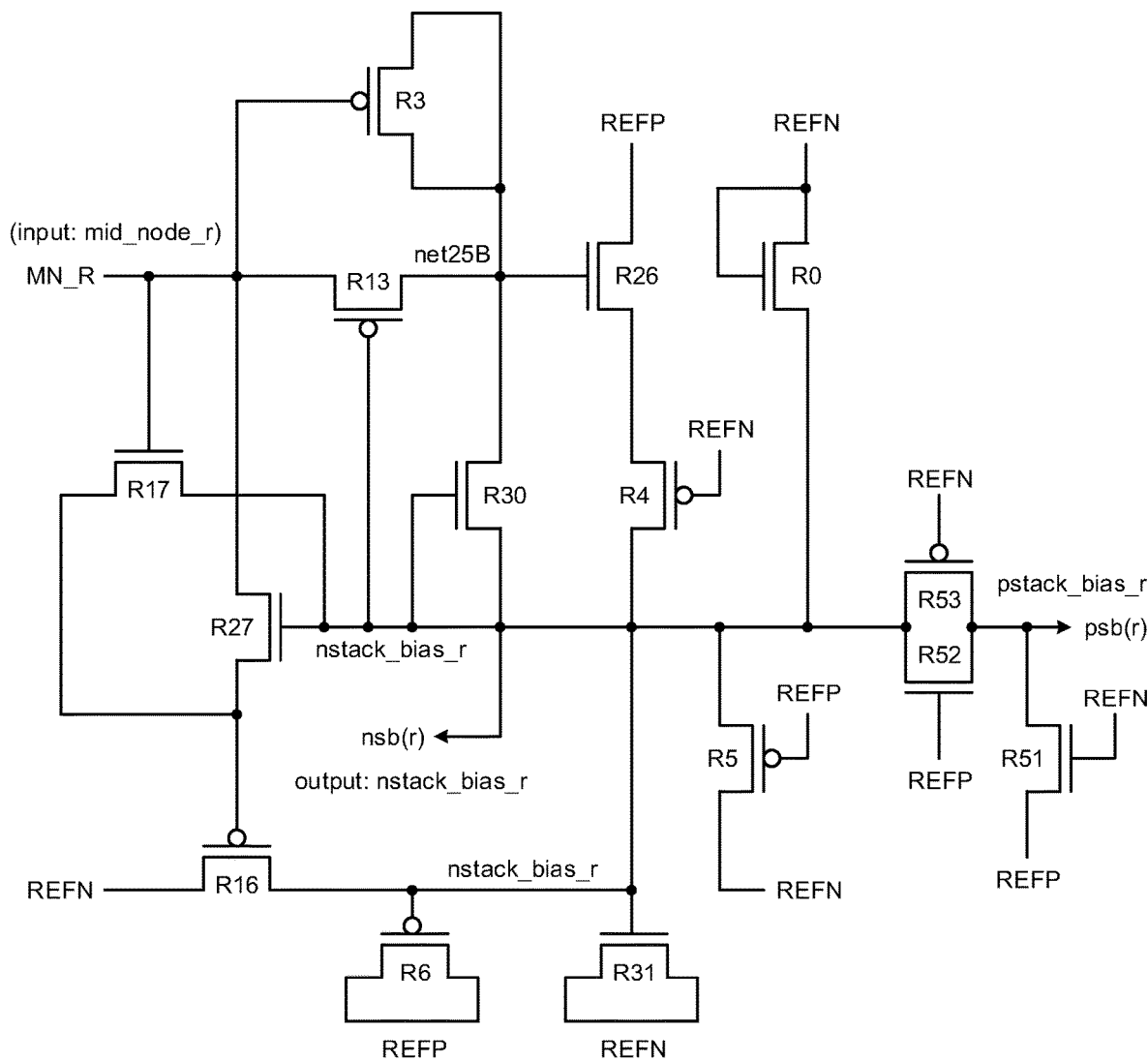

The level shifting circuitry 114 may include bias generation circuitry 218A, 218B having second transistors that are arranged and configured to track voltage changes in the dynamically biased voltage (MN_L, MN_R) and adjust the dynamically biased voltage (MN_L, MN_R) by generating bias voltages (p_stack_bias, n_stack_bias, e.g., as shown in FIGS. 4A-4B) based on the reference voltages (REFP, REFN) and/or by also applying the bias voltages (p_stack_bias, n_stack_bias) to one or more of the first transistors in the header circuitry 208 so as to thereby adjust the dynamically biased voltage (MN_L, MN_R). In various instances, the bias generation circuitry 218A, 218B may be configured to provide the bias voltages (REFP, REFN) so as to avoid stress and/or reliability issues related to any transistors in the level shifting circuitry 114 and any related components including the first transistors, the second transistors, the third transistors, etc. In various implementations, the first bias generation circuitry 218A may receive the reference signals (REFP, REFN) and the first intermediate node (MN_L), and the second bias generation circuitry 218B may receive the reference signals (REFP, REFN) and the second intermediate node (MN_R). Also, logic associated with the bias generation circuitry 218A, 218B is described in greater detail herein in reference to FIGS. 4A-4B.

FIG. 3 illustrates a diagram 300 of the first stage of the header circuitry 208 in accordance with various implementations described herein. In some implementations, as described above in reference to the header circuitry 208 in FIG. 2, the first transistors of the header circuitry 208 may be arranged and configured in the first stage.

As shown in FIG. 3, the first stage of the header circuitry 208 may include the first transistors (T1, T2, T3, T4, T5, T6, T7, T8). In some implementations, the first stage may include cross-coupled transistors (T1, T2) that are coupled between the IO supply voltage (dvdd) and first stacked transistors (T3, T5, T7 and T4, T6, T8), wherein the first stacked transistors (T3, T5, T7 and T4, T6, T8) may be coupled to gates of the cross-coupled transistors (T1, T2) and the output nodes (e.g., NA, NB, REFP). Transistor (T1) may be coupled between the IO supply voltage (dvdd) and the first output node (NA) that may also refer to the first boost supply node (Bst_R), and transistor (T2) may be coupled between the IO supply voltage (dvdd) and the second output node (NB) that may also refer to the second boost supply node (Bst_L). The stacked transistors (T3, T5, T7) may be coupled in series between transistor (T1) and the REFP signal, and also, the stacked transistors (T4, T6, T8) may be coupled in series between transistor (T2) and the REFP signal. Also, the stacked transistors (T3, T5, T7) may be coupled in parallel with the other stacked transistors (T4, T6, T8). In some implementations, transistors (T1, T2) are PMOS transistors, and transistors (T3, T5, T7 and T4, T6, T8) are NMOS transistors, wherein drains of PMOS transistors (T1, T2) are coupled to drains of NMOS transistors (T3, T4), respectively. Also, in reference to the cross-coupling of transistors (T1, T2), the gate of transistor (T1) may be coupled to the second boost supply node (Bst_L), and the gate of transistor (T2) may be coupled to the first boost supply node (Bst_R).

Figure 4C:
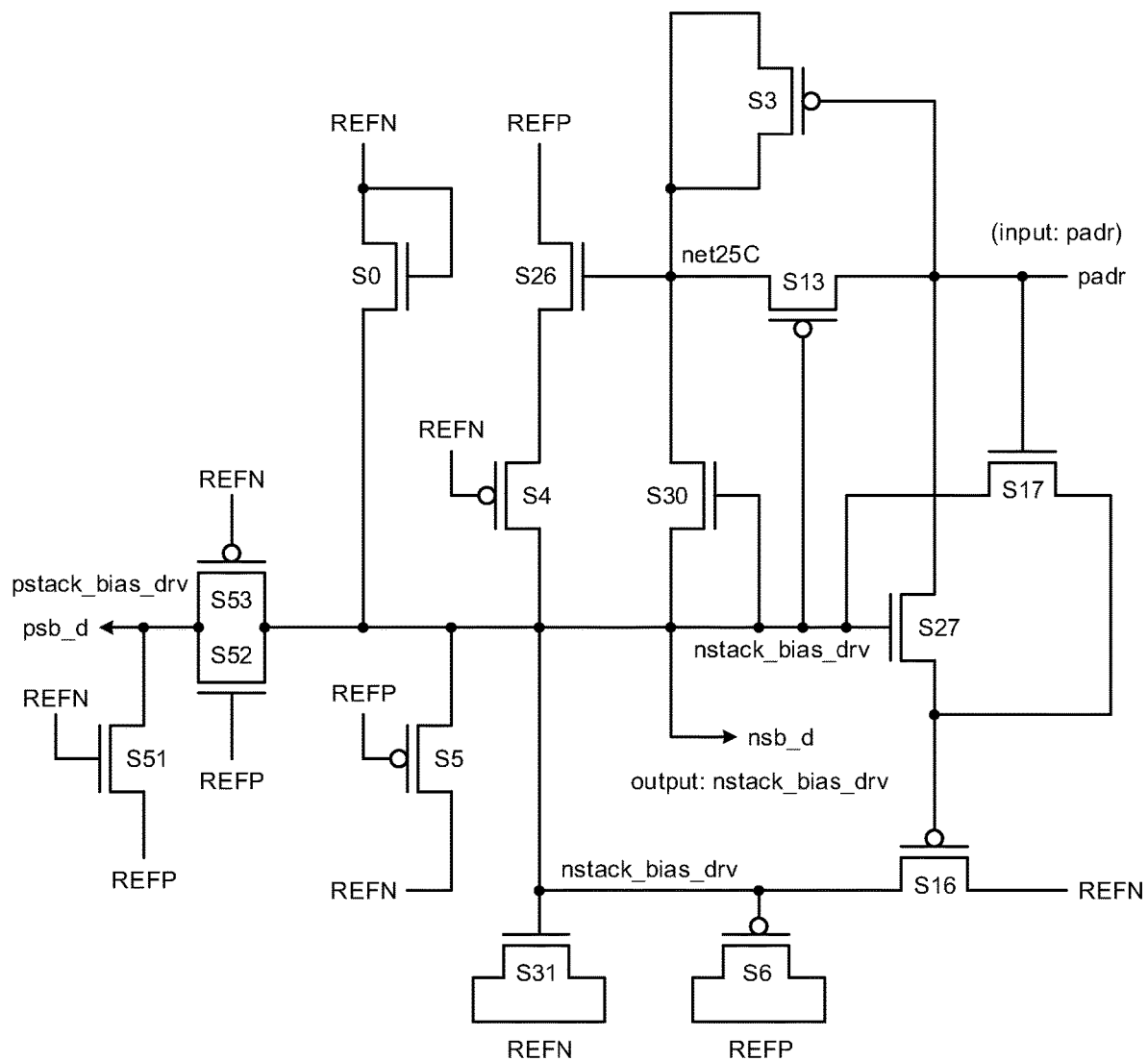

FIGS. 4A-4C illustrate various diagrams of the bias generation circuitry 218A, 218B in accordance with various implementations described herein. In particular, FIG. 4A shows a diagram 400A of the first bias generation circuitry 218A, FIG. 4B shows a diagram 400B of the second bias generation circuitry 218B, and also, FIG. 4C shows a diagram 400C of the third bias generation circuitry 218C.

As shown in FIG. 4A, the first bias generation circuitry 218A may include the second transistors (L0-L53) that may be arranged and configured to receive the dynamically biased voltage (MN_L) from the level shifting circuitry 114. In some implementations, the second transistors (L0-L53) of the bias generation circuitry 218A may be configured to receive the dynamically biased voltage (MN_L), receive the reference voltages (REFP, REFN), and provide stack-bias voltages (p_stack_bias, n_stack_bias) based on the dynamically biased voltage (MN_L) and the reference voltages (REFP, REFN).

In some implementations, the first bias generation circuitry 218A may include transistors (L3, L13, L17, L27) coupled to the intermediate node (MN_L), which may be referred to as a left-side bias input node (mid_node_l). Transistor (L17) may be coupled between node (nstack_bias_l) and a gate of transistor (L16), and the MN_L signal may be coupled to a gate of transistor (L17). Transistor (L13) may be coupled between node (net25A) and node (MN_L), and a gate of transistor (L13) may be coupled to node (nstack_bias_l). Transistor (L3) may be coupled as a capacitor to node (net25A), and a gate of transistor (L3) may be coupled to node (MN_L). Transistor (L27) may be coupled between node (MN_L) and the gate of transistor (L16), and a gate of transistor (L27) may be coupled to node (nstack_bias_l). In some instances, transistors (L3, L13) may refer to PMOS transistors, and transistors (L17, L27) may refer to NMOS transistors.

In some implementations, the first bias generation circuitry 218A may include transistors (L0, L4, L26, L30) coupled to node (nstack_bias_l), which may be referred to as a left-side bias output node (nsb(l)). Transistor (L0) may be coupled as a diode, and transistor (L0) may be coupled to node (nstack_bias_l). Transistors (L4, L26) may be coupled in series between node (REFP) and node (nstack_bias_l), and a gate of transistor (L4) may be coupled to node (REFN), and a gate of transistor (L26) may be coupled to node (net25A). Transistor (L30) may be coupled between node (nstack_bias_l) and node (net25A), and a gate of transistor (L30) may be coupled to node (nstack_bias_l). In some instances, transistor (L4) may refer to a PMOS transistor, and transistors (L0, L26, L30) may refer to NMOS transistors.

In some implementations, the first bias generation circuitry 218A may include transistors (L5, L6, L16, L31) coupled to node (nstack_bias_l), which may be referred to as the left-side bias output node (nsb(l)). Transistor (L5) may be coupled between node (nstack_bias_l) and node (REFN), and a gate of transistor (L5) may be coupled to node (REFP). Transistor (L16) may be coupled between node (nstack_bias_l) and node (REFN), and a gate of transistor (L16) may be coupled to transistor (L27). Transistors (L6, L31) may be coupled as capacitors, and gates of transistors (L6, L31) may be coupled to node (nstack_bias_l). In some instances, transistors (L5, L6, L16) may refer to PMOS transistors, and transistor (L31) may refer to a NMOS transistor.

In some implementations, the first bias generation circuitry 218A may include transistors (L51, L52, L53) coupled to node (nstack_bias_l) and/or node (pstack_bias_l), which may be referred to as the left-side bias output node (psb(l)). Transistors (L52, L53) may be coupled in parallel between node (nstack_bias_l) and node (pstack_bias_l), and a gate of transistor (L52) may be coupled to node (REFP), and a gate of transistor (L53) may be coupled to node (REFN). Transistor (L51) may be coupled between node (psb(l)) and node (REFP), and a gate of transistor (L51) may be coupled to node (REFN). Also, in some instances, transistor (L53) may refer to a PMOS transistor, and transistors (L51, L52) may refer to NMOS transistors.

In some implementations, when dvdd changes from 2.5V and 3.3V, REFN=1.2V, so REFP will vary from 1.3V to 2.1V (REFP=DVDD−REFN). Also, NMOS (L51) is off as VGS<Vthn, and nstack_bias_l signal will be passed to pstack_bias_l. Whenever MN_L switches from 0 and dvdd, the nstack_bias_l node will switch from REFN to REFP. When nstack_bias_l is REFN, then NMOS (L52) will be on, and PMOS (L53) will be off. Also, pstack_bias_l will be same as nstack_bias_l by NMOS (L52). When nstack_bias_l is REFP (or MN_L is DVDD), PMOS (L53) will be on, and the pstack_bias_l node will be made equal to REFP by PMOS (L53).

In some implementations, when DVDD is 1.8V, REFN=1.2V and REFP=0.6V (as REFP=DVDD−REFN). When MN_L changes from 0 to DVDD, nstack_bias_l always stay at REFN by PMOS (L5). PMOS (L53) will be off, and NMOS (L51) will be on. Also, NMOS (L51) will make pstack_bias_l node to REFP, which will make sure that NMOS (L52) is off. Thus, in some instances, at DVDD=1.8V operation, nstack_bias_l is always at REFN, and pstack_bias_l is always at REFP.

As shown in FIG. 4B, the second bias generation circuitry 218B may include the second transistors (R0-R53) that may be arranged and configured to receive the dynamically biased voltage (MN_R) from the level shifting circuitry 114. In some implementations, the second transistors (R0-R53) of the bias generation circuitry 218B may be configured to receive the dynamically biased voltage (MN_R), receive the reference voltages (REFP, REFN), and also provide stack-bias voltages (p_stack_bias_r, n_stack_bias_r) based on the dynamically biased voltage (MN_R) and the reference voltages (REFP, REFN).

In some implementations, the second bias generation circuitry 218B may include transistors (R3, R13, R17, R27) coupled to the intermediate node (MN_R), which may be referred to as a right-side bias input node (mid_node_r). Transistor (R17) may be coupled between node (nstack_bias_r) and a gate of transistor (R16), and the MN_R signal may be coupled to a gate of transistor (R17). Transistor (R13) may be coupled between node (net25B) and node (MN_R), and a gate of transistor (R13) may be coupled to node (nstack_bias_r). Transistor (R3) may be coupled as a capacitor to node (net25B), and a gate of transistor (R3) may be coupled to node (MN_R). Transistor (R27) may be coupled between node (MN_R) and the gate of transistor (R16), and a gate of transistor (R27) may be coupled to node (nstack_bias_r). In some instances, transistors (R3, R13) may refer to PMOS transistors, and transistors (R17, R27) may refer to NMOS transistors.

In some implementations, the second bias generation circuitry 218B may include transistors (R0, R4, R26, R30) coupled to node (nstack_bias_r), which may be referred to as a right-side bias output node (nsb(r)). Transistor (R0) may be coupled as a diode, and transistor (R0) may be coupled to node (nstack_bias_r). Transistors (R4, R26) may be coupled in series between node (REFP) and node (nstack_bias_r), and a gate of transistor (R4) may be coupled to node (REFN), and a gate of transistor (R26) may be coupled to node (net25B). Transistor (R30) may be coupled between node (nstack_bias_r) and node (net25B), and a gate of transistor (R30) may be coupled to node (nstack_bias_r). In some instances, transistor (R4) may refer to a PMOS transistor, and transistors (R0, R26, R30) may refer to NMOS transistors.

In some implementations, the second bias generation circuitry 218B may include transistors (R5, R6, R16, R31) coupled to node (nstack_bias_r), which may be referred to as the right-side bias output node (nsb(r)). Transistor (R5) may be coupled between node (nstack_bias_r) and node (REFN), and a gate of transistor (R5) may be coupled to node (REFP). Transistor (R16) may be coupled between node (nstack_bias_r) and node (REFN), and a gate of transistor (R16) may be coupled to transistor (R27). Transistors (R6, R31) may be coupled as capacitors, and gates of transistors (R6, R31) may be coupled to node (nstack_bias_r). In some instances, transistors (R5, R6, R16) may refer to PMOS transistors, and transistor (R31) may refer to a NMOS transistor.

In some implementations, the second bias generation circuitry 218B may include transistors (R51, R52, R53) coupled to node (nstack_bias_r) and/or node (pstack_bias_r), which may be referred to as the right-side bias output node (psb(r)). Transistors (R52, R53) may be coupled in parallel between node (nstack_bias_r) and node (pstack_bias_r), and a gate of transistor (R52) may be coupled to node (REFP), and a gate of transistor (R53) may be coupled to node (REFN). Transistor (R51) may be coupled between node (psb(r)) and node (REFP), and a gate of transistor (R51) may be coupled to node (REFN). Also, in some instances, transistor (R53) may refer to a PMOS transistor, and transistors (R51, R52) may refer to NMOS transistors.

As shown in FIG. 4C, the third bias generation circuitry 218C may include the transistors (S0-S53) that may be arranged and configured to receive an input padr voltage (padr). In some implementations, the transistors (S0-S53) of the bias generation circuitry 218C may be configured to receive the padr voltage (padr), receive the reference voltages (REFP, REFN), and provide stack-bias drive voltages (pstack_bias_drv, nstack_bias_drv) based on the padr voltage (padr) and the reference voltages (REFP, REFN). In some instances, the input padr voltage (padr) may be provided by other circuitry, such as, e.g., padr generation circuitry 704B, as shown in FIG. 7B.

In some implementations, the third bias generation circuitry 218C may include transistors (S3, S13, S17, S27) coupled to node (padr). Transistor (S17) may be coupled between node (nstack_bias_drv) and a gate of transistor (S16), and the padr signal may be coupled to a gate of transistor (S17). Transistor (S13) may be coupled between node (net25C) and node (padr), and a gate of transistor (S13) may be coupled to node (nstack_bias_drv). Transistor (S3) may be coupled as a capacitor to node (net25C), and a gate of transistor (S3) may be coupled to node (padr). Transistor (S27) may be coupled between node (padr) and the gate of transistor (S16), and a gate of transistor (S27) may be coupled to node (nstack_bias_drv). In some instances, transistors (S3, S13) may refer to PMOS transistors, and transistors (S17, S27) may refer to NMOS transistors.

In some implementations, the third bias generation circuitry 218C may include transistors (S0, S4, S26, S30) coupled to node (nstack_bias_drv). Transistor (S0) may be coupled as a diode, and transistor (S0) may be coupled to node (nstack_bias_drv). Transistors (S4, S26) may be coupled between node (REFP) and node (nstack_bias_drv), and a gate of transistor (S4) may be coupled to node (REFN), and a gate of transistor (S26) may be coupled to node (net25C). Transistor (S30) may be coupled between node (nstack_bias_drv) and node (net25C), and a gate of transistor (S30) may be coupled to node (nstack_bias_drv). Also, in some instances, transistor (S4) may refer to a PMOS transistor, and transistors (S0, S26, S30) may refer to NMOS transistors.

In some implementations, the third bias generation circuitry 218C may include transistors (S5, S6, S16, S31) coupled to node (nstack_bias_drv). Transistor (S5) may be coupled between node (nstack_bias_drv) and node (REFN), and a gate of transistor (S5) may be coupled to node (REFP). Transistor (S16) may be coupled between node (nstack_bias_drv) and node (REFN), and a gate of transistor (S16) may be coupled to transistor (S27). Transistors (S6, S31) are coupled as capacitors, and gates of transistors (S6, S31) may be coupled to node (nstack_bias_drv). Also, transistors (S5, S6, S16) may refer to PMOS transistors, and transistor (S31) may refer to a NMOS transistor.

In some implementations, the third bias generation circuitry 218C may include transistors (S51, S52, S53) coupled to node (nstack_bias_drv), which may be referred to as output node (psb_d). Transistors (S52, S53) may be coupled in parallel between node (nstack_bias_drv) and (pstack_bias_drv), and a gate of transistor (S52) may be coupled to node (REFP), and a gate of transistor (S53) may be coupled to node (REFN). Transistor (S51) may be coupled between node (psb_d) and node (REFP), and a gate of transistor (S51) may be coupled to node (REFN). Also, transistor (S53) may refer to a PMOS transistor, and transistors (S51, S52) may refer to NMOS transistors.

In some implementations, the outputs of circuit 218C are pstack_bias_dry and nstack_bias_drv, which are applied to the driver block. The pstack_bias_dry signal may be applied to the gate of transistor D14 of circuit 124, and the nstack_bias_dry signal may be applied to the gate of transistor D24 of circuit 124. The gates of transistors (D14, D24) may be automatically adjusted with signals (pstack_bias_drv, nstack_bias_drv) based on the output PAD voltage so that no voltage overstress is observed across the driver circuit 124. The padr signal may be generated from the PAD node using a resistor to provide electro-static discharge (ESD) protection for circuit 218C. The voltage levels of padr may be the same as PAD. Whenever PAD transits a logic level, the PAD state is switched from 0V to DVDD (3.3V/2.5V/1.8V). When PAD switches from 0V to 3.3V/2.5V, then the pstack_bias_dry signal changes from REFN to REFP in such a way that there is no stress across the source, drain and gate terminals of D14. It also ensures that there is no stress across D13 and D12. Likewise, nstack_bias_dry changes from REFN to REFP to ensure that no voltage overstress is seen across the source, drain and gate terminals of D24 as well as D23 and D22. In 1.8V operation (when DVDD=1.8V), nstack_bias_dry node may be set to REFN, and the pstack_bias_dry node is set to REFP. This ensures reliability for transistors D22, D23, D24 and D14, d13 and D12. As such, irrespective of PAD state (0V or 1.8V), pstack_biad_dry may be REFP, and nstack_bias_dry may be REFN.

Also, when PAD transmits a logic '0', then PAD changes its state from DVDD (3.3V/2.5V/1.8V) to 0V. When PAD switches from 3.3V/2.5V to 0V, then pstack_bias_dry and nstack_bias_dry signals change from REFP to REFN dynamically in such a way that there is no stress across the source, drain and gate terminals of transistors D14, D13 and transistors D12, D24, D23 and D22. Likewise, for 1.8V operation (e.g., when DVDD=1.8V), the nstack_bias_dry node may be set to REFN, and the pstack_bias_dry node may be set to REFP irrespective of PAD state or switching conditions, which may ensure reliability for transistors D22, D23, D24 and transistors D14, D13 and D12.

Figure 5:
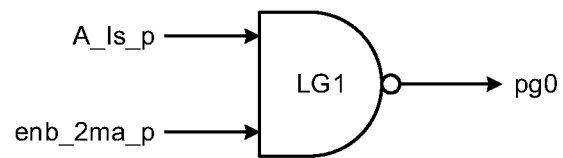
FIG. 5 illustrates a diagram of pre-driver circuitry in accordance with various implementations described herein.
Figure 5:
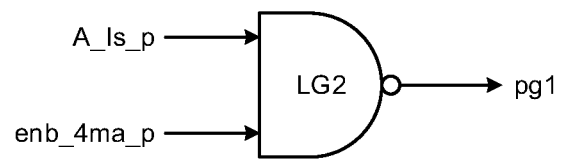
Figure 5:
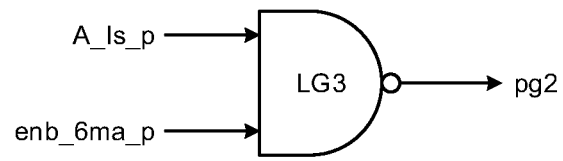
Figure 5:
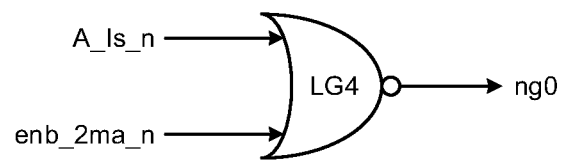
Figure 5:
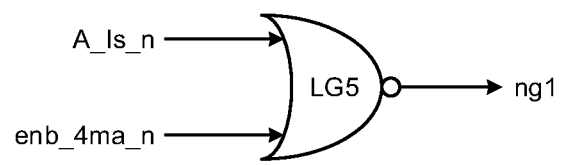
Figure 5:
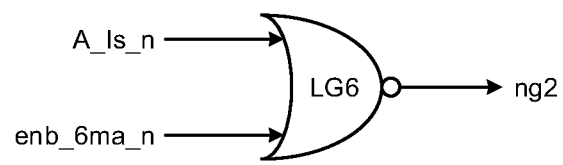

FIG. 5 illustrates a diagram 500 of the pre-driver circuitry 118 in accordance with various implementations described herein.

As shown in FIG. 5, the pre-driver circuitry 118 may include logic, such as, e.g., various logic gates that are configured to receive various input signals (e.g., A_ls_p, A_ls_n), receive various enable signals (e.g., <enb>), and provide various output signals (e.g., <pg>, <ng>). In various implementations, the logic gates may include one or more first logic gates (L1, L2, L3) and one or more second logic gates (L4, L5, L6).

The first logic gates (LG1, LG2, LG3) may include a first logic gate (LG1), a second logic gate (LG2), and a third logic gate (LG3). The first logic gate (LG1) may receive multiple input signals (A_ls_p, enb_2ma_p) and provide an output signal (pg0). The second logic gate (LG2) may receive multiple input signals (A_ls_p, enb_4ma_p) and provide an output signal (pg1). Also, the third logic gate (LG3) may receive multiple input signals (A_ls_p, enb_6ma_p) and provide an output signal (pg2). In some instances, the first logic gates (LG1, LG2, LG3) may be implemented with NAND gates.

The second logic gates (LG4, LG5, LG6) may include a fourth logic gate (LG4), a fifth logic gate (LG5), and a sixth logic gate (LG6). The fourth logic gate (LG4) may receive multiple input signals (A_ls_n, enb_2ma_n) and provide an output signal (ng0). The fifth logic gate (LG5) may receive multiple input signals (A_ls_n, enb_4ma_n) and provide an output signal (ng1). Also, the sixth logic gate (LG6) may receive multiple input signals (A_ls_n, enb_6ma_n) and provide an output signal (ng2). In some instances, the second logic gates (LG4, LG5, LG6) may be implemented with NOR gates.

Figure 6:
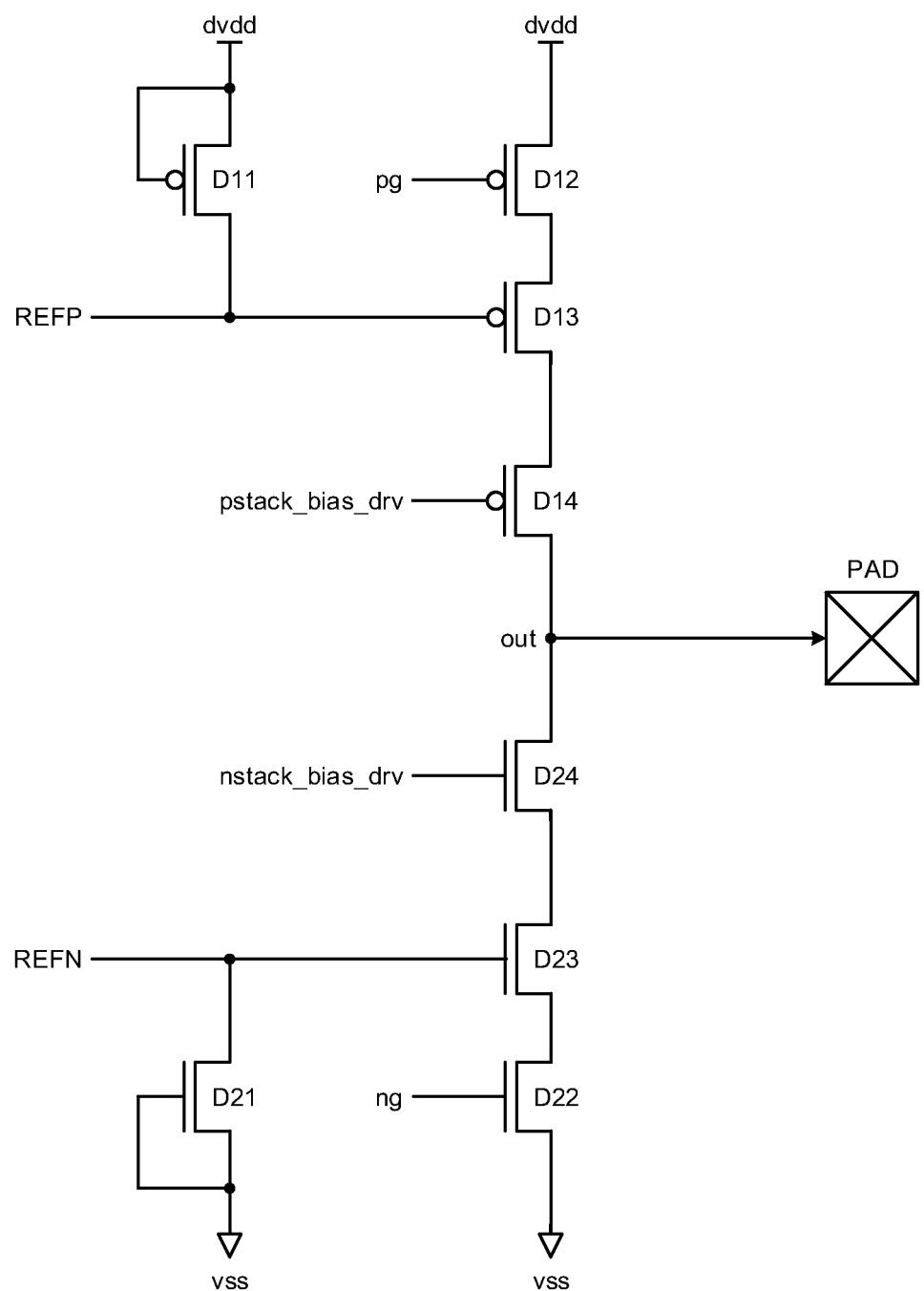
FIG. 6 illustrates a diagram of bias driver circuitry in accordance with various implementations described herein.

FIG. 6 illustrates a diagram 600 of the bias driver circuitry 124 in accordance with various implementations described herein.

As shown in FIG. 6, the bias driver circuitry 124 may include fourth transistors (D11-D22) that are configured to receive the IO supply voltage domain (dvdd), receive the reference voltages (REFP, REFN), receive the multiple stack-bias voltages (pstack_bias, nstack_bias), receive the node voltages (<pg>, <ng>) and provide the output pad voltage (out) to the output pad (PAD). In some instances, stack-bias voltages (pstack_bias, nstack_bias) may refer to the pstack_bias_drv voltage signals and/or the nstack_bias WO voltage signals.

In some implementations, the bias driver circuitry 124 may include a first stack of transistors (D12, D13, D14) that are coupled in series between the IO supply voltage (dvdd) and the output node (out). Also, the bias driver circuitry 124 may include transistor (D11) coupled as a diode between the IO supply voltage (dvdd) and a gate of transistor (D13). Also, a gate of transistor (D12) may be coupled to node (pg), a gate of transistor (D13) may be coupled to node (REFP), and a gate of transistor (D14) may be coupled to node (pstack_bias_drv). Transistors (D11, D12, D13, D14) refer to PMOS transistors.

In some implementations, the bias driver circuitry 124 may include a second stack of transistors (D22, D23, D24) that are coupled in series between the output node (out) and ground (Gnd or Vss). Also, the bias driver circuitry 124 may include transistor (D21) coupled as a diode between a gate of transistor (D23) and ground (Gnd or Vss). Also, a gate of transistor (D22) may be coupled to node (ng), a gate of transistor (D23) may be coupled to node (REFN), and a gate of transistor (D24) may be coupled to node (nstack_bias_drv). Transistors (D21, D22, D23, D24) refer to NMOS transistors.

In some implementations, the overdrive IO circuitry may be designed with three stacks, and the gate of the topmost stack for the NMOS and the bottommost stack for the PMOS are automatically adjusted in accordance to the output node voltage (e.g., the drain of the 3-stacked MOS devices). By implementing this auto-adjustment feature, the circuitry design may limit the total number of stacks within three, which may be used to achieve an improved timing behavior.

In some implementations, the gate of the topmost NMOS transistor stack and the bottommost PMOS transistor stack may be dynamically biased based on the output voltage (out), and also, whenever the output voltage (out) or the output PAD rises from 0 to dvdd (3.3V/2.5V), then the output voltage (out) is coupled to net25 (gate of M26), when PADR/PAD voltage is greater than REFP. Thus, the stack_bias signals (nstack_bias_drv, pstack_bias_drv) become equal to REFP, when PAD> REFP. While PAD falls down, and once the PAD goes below REFN, then transistor S27 allows the PAD to couple to the gate of transistor S16, which eventually passes REFN to the stack_bias node (nstack_bias_drv, pstack_bias_drv). In 1.8V operation, when DVDD=1.8V, PAD/padr switch from 0V to 1.8V when transmitting logic '1' and from 1.8V to 0V when transmitting logic '0'. In this condition, nstack_bias_dry may be set to REFN, and pstack_bias_dry may be set to REFP to avoid any reliability issue in the driver circuit 124.

Figure 7A:
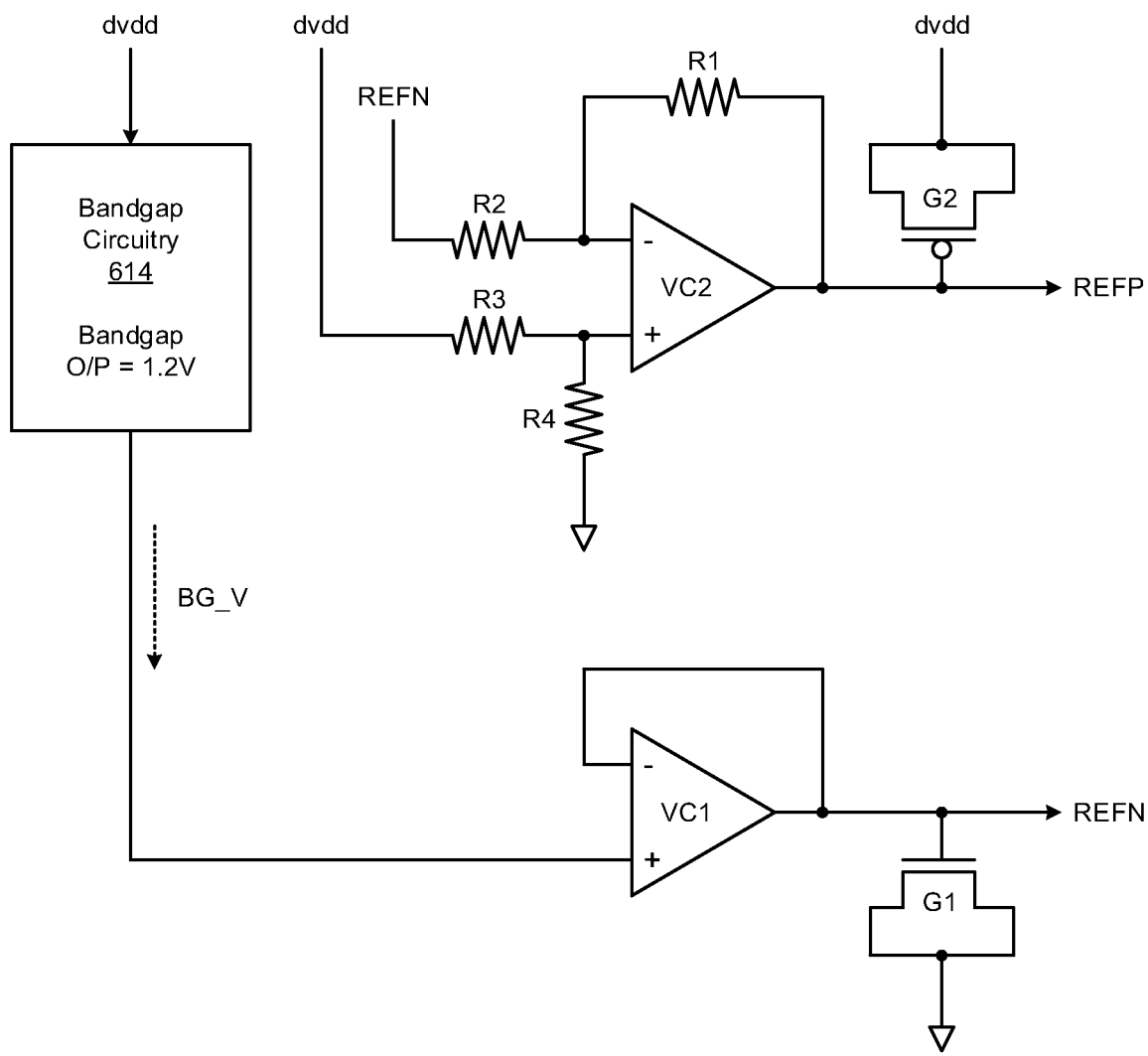
FIG. 7A illustrates a diagram of reference generator circuitry in accordance with various implementations described herein.
Figure 7B:
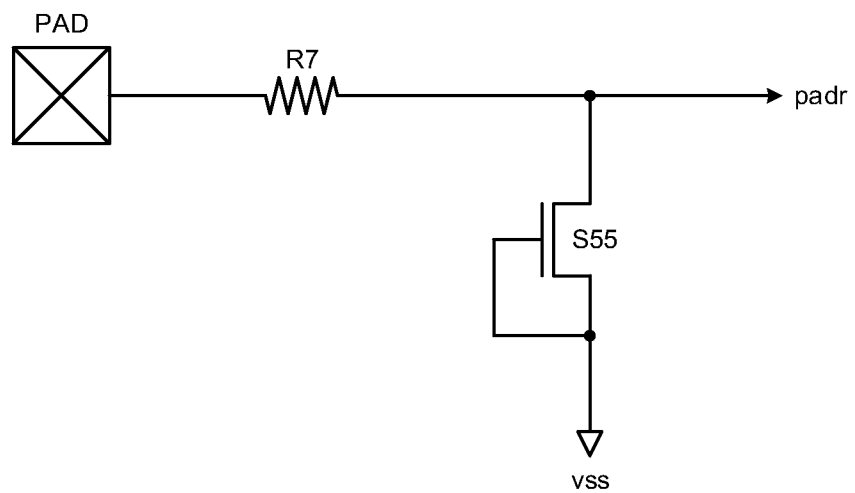
FIG. 7B illustrates a diagram of PADR generator circuitry in accordance with various implementations described herein.

FIG. 7A illustrates a schematic diagram 700A of the reference generator circuitry 704A in accordance with various implementations described herein.

As shown in FIG. 7A, the reference generator circuitry 704A may have buffered bandgap circuitry 614 that receives the IO supply voltage (dvdd) and provides a bandgap voltage (BG_V) based on the IO supply voltage (dvdd). The reference generator circuitry 704A may include the multiple amplifiers (VC1, VC2), including, e.g., a first amplifier (VC1) and a second amplifier (VC2). The first amplifier (VC1) may be configured to receive the bandgap voltage (BG_V) at a non-inverting input (+), receive the reference voltage (REFN) at an inverting input (−) as feedback, and provide the reference voltage (REFN) as output. The second amplifier (VC2) may be configured to receive the supply voltage (dvdd) at a non-inverting input (+) via resistor (R3), receive the reference voltage (REFN) at an inverting input (−) via resistor (R2), receive the reference voltage (REFP) at the inverting input (−) as feedback via resistor (R1), and also provide the reference voltage (REFP) as output. Also, in some instances, the bandgap voltage (BG_V) may refer to an output (O/P) voltage of approximately 1.2V.

In some implementations, the first amplifier (VC1) receives the bandgap voltage (BG_V), receives the REFN signal (as feedback from its own output node), and provides the REFN signal as output. The first amplifier (VC1) may also include transistor (G1) that is coupled together to operate as a capacitor, and also, a gate of transistor (G1) is coupled to the output node of the first amplifier (VC1). Also, the second amplifier (VC2) receives the IO supply voltage (dvdd) via resistor (R3), receives the REFN signal via resistor (R2), receives the REFP signal (as feedback from its own output node) via resistor (R1), and then provides the REFP signal as output. The second amplifier (VC2) may also include transistor (G2) that is coupled together to operate as a capacitor, and a gate of transistor (G2) is also coupled to the output node of the second amplifier (VC2). Also, resistor (R4) may be coupled between resistor (R3) and ground (Gnd or Vss). Also, the resistor (R1) may be coupled between the output of the second amplifier (VC2) and the input of the second amplifier (VC2) at the output of the resistor (R2).

In some implementations, the reference biasing signals (REFN, REFP) may be generated with the reference generation circuitry 704A. The REFN signal refers to a 1.2V bias that is generated with the buffered bandgap circuitry 614. The output of the bandgap circuitry 614 is buffered so that the voltage of the REFN signal is stable, constant, and equal to 1.2V. Also, REFP refers to a difference between dvdd and REFN. When dvdd=3.3V, REFN=1.2V and REFP=2.1V. Likewise, when dvdd=2.5V, then REFN=1.2V and REFP=1.3V.

FIG. 7B illustrates a diagram 700B of the PADR generator circuitry 704B in accordance with various implementations described herein.

As shown in FIG. 7B, the PADR generator circuitry 704B may include at least one resistor (R7) coupled between the output pad (PAD) and the node (padr). In some instances, the PADR generator circuitry 704B may include a transistor (S55) that provides a ground-gate NMOS, and the transistor (S55) may be coupled between the node (padr) and ground (vss or gnd). In some implementations, the resistor (R7) may be referred to as a secondary resistor having a resistance value of approximately 5000. As described herein the PADR generator circuitry 704B may be configured to receive the PAD voltage as input from the output pad (PAD) and provide the padr voltage (padr) as output.

In some implementations, the PADR generator circuitry 704B may operate as secondary ESD protection circuitry that is used before applying the PAD voltage directly to gates of transistors (S3, S17, instead of PAD voltage) in the third bias generation circuitry 218C. Also, the secondary protection circuitry (i.e., 704B) may be configured to generate the padr signal as output, which may be safely applied to the gates of transistors (S3, S17) used in the bias generation circuitry 218C as a driver signal.

Figure 8:
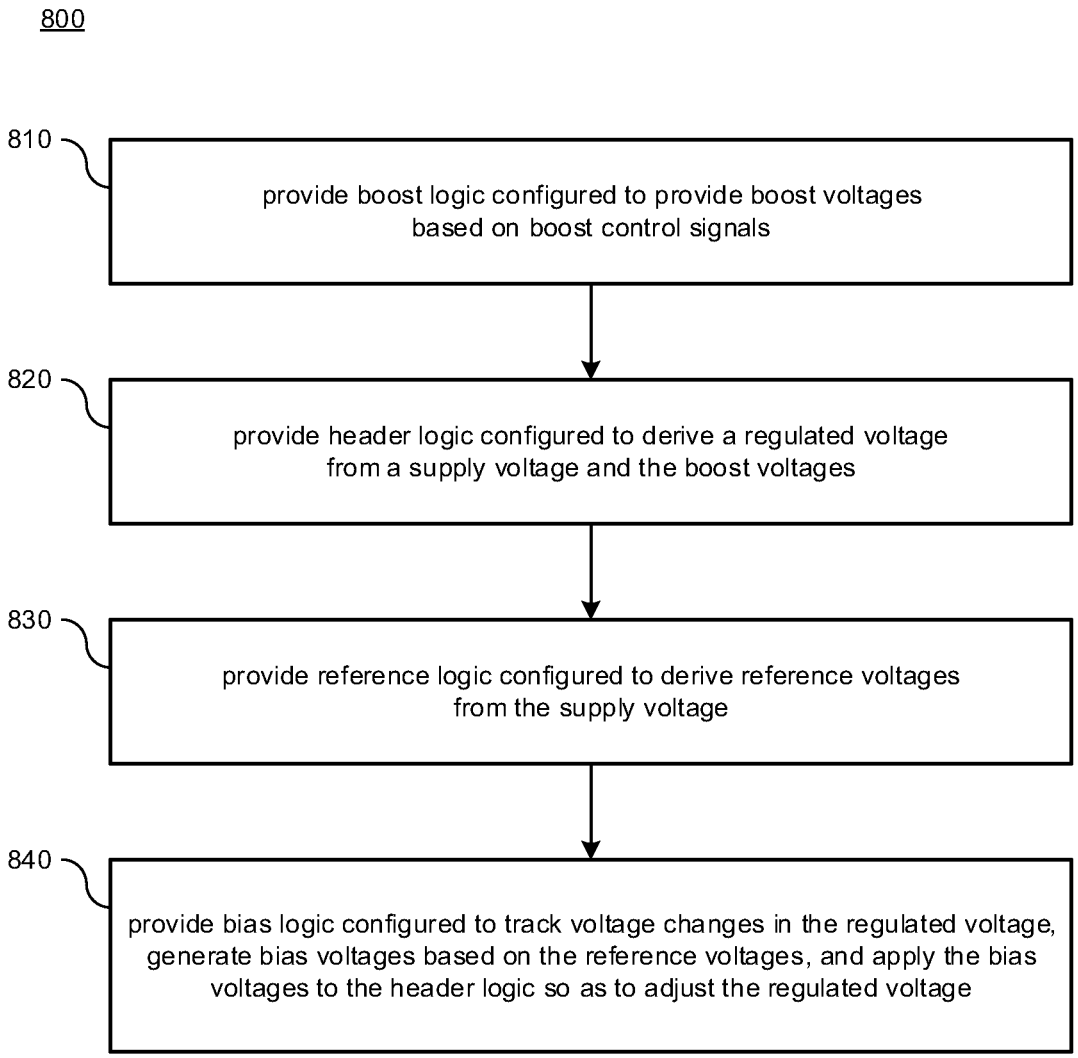
FIG. 8 illustrates a process flow diagram of a method for providing overdrive IO circuitry in accordance with various implementations described herein.

FIG. 8 illustrates a process diagram of a method 800 for providing overdrive IO circuitry in accordance with various implementations described herein.

It should be understood that even though method 800 may indicate a particular order of operation execution, in some cases, various portions of the operations may be executed in a different order, and on different systems. In other cases, other operations and/or steps may be added to and/or omitted from method 800. Also, method 800 may be implemented in hardware and/or software. If implemented in hardware, method 800 may be implemented with components and/or circuitry, as described herein in reference to FIGS. 1-7B. Also, if implemented in software, method 800 may be implemented as a program and/or software instruction process that is configured for providing the various schemes and techniques described herein. Also, if implemented in software, instructions related to implementing method 800 may be recorded in memory and/or a database. For instance, various types of computing devices having at least one processor and memory may be configured to perform method 800.

In various implementations, method 800 may refer to a method of designing, providing, building, fabricating and/or manufacturing overdrive IO output architecture as an integrated system, device and/or circuitry that may involve use of the various circuit components described herein so as to implement the various schemes and techniques associated therewith. In some implementations, the overdrive IO output architecture may be integrated with computing circuitry and various related components on a single chip, and also, the overdrive IO output architecture may be implemented in various embedded chip-level systems for various electronic, mobile and Internet-of-things (IoT) applications, including remote sensor node applications.

At block 810, method 800 may fabricate boost logic that is configured to provide boost voltages based on boost control signals. At block 820, method 800 may fabricate header logic that is configured to derive a dynamically biased voltage from a supply voltage and/or the boost voltages. In some instances, the header logic may be configured to derive the dynamically biased voltage from the supply voltage and/or the boost voltages. Also, the dynamically biased voltage may be configured to operate within a multi-voltage range that is associated with different voltage levels that are related to one or more of 1.8V, 2.5V and 3.3V.

At block 830, method 800 may fabricate reference logic that is configured to derive reference voltages from the supply voltage. The reference logic may have buffered bandgap logic that is configured to derive a bandgap voltage based on the supply voltage. The reference logic may have a first amplifier that is configured to derive a first reference voltage of the reference voltages from the bandgap voltage, and the reference logic may have a second amplifier that is configured to derive a second reference voltage of the reference voltages from the supply voltage and the first reference voltage.

At block 840, method 800 may fabricate bias logic that is configured to track voltage changes in the dynamically biased voltage, generate bias voltages based on the reference voltages, and/or apply the bias voltages to the header logic so as to adjust the dynamically biased voltage. In some implementations, the bias logic may provide the bias voltages so as to avoid stress or reliability issues related to one or more or any or all transistors in the boost logic, the header logic, the reference logic, and/or the bias logic. In other instances, the bias logic may provide the bias voltages without any reliability issues related to one or more or any or all transistors.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include header circuitry having first transistors that are configured to receive a supply voltage and provide a dynamically biased voltage. The device may include reference generation circuitry having multiple amplifiers that are configured to receive the supply voltage and provide reference voltages based on the supply voltage. The device may include bias generation circuitry having second transistors that are configured to track changes in the dynamically biased voltage and adjust the dynamically biased voltage by generating bias voltages based on the reference voltages and by applying the bias voltages to the header circuitry so as to adjust the dynamically biased voltage.

Described herein are various implementations of an output circuit. The output circuit may include boost logic that is configured to provide boost voltages based on boost control signals. The output circuit may include header logic that is configured to derive a dynamically biased voltage from a supply voltage and the boost voltages. The output circuit may include reference logic that is configured to derive reference voltages from the supply voltage. The output circuit may include bias logic that is configured to track voltage changes in the dynamically biased voltage, generate bias voltages based on the reference voltages, and apply the bias voltages to the header logic so as to adjust the dynamically biased voltage.

Described herein are various implementations of a method. The method may include providing header logic that derives a dynamically biased voltage from a supply voltage. The method may include providing reference logic that derives reference voltages from the supply voltage. The method may include providing bias logic that tracks changes in the dynamically biased voltage, generates bias voltages based on the reference voltages, and applies the bias voltages to the header logic so as to adjust the dynamically biased voltage.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   header circuitry having first transistors configured to receive a supply voltage and provide a dynamically biased voltage;
   reference generation circuitry having multiple amplifiers configured to receive the supply voltage and provide reference voltages based on the supply voltage;
   bias generation circuitry having second transistors configured to track changes in the dynamically biased voltage and adjust the dynamically biased voltage by generating bias voltages based on the reference voltages and by applying the bias voltages to the header circuitry so as to adjust the dynamically biased voltage; and
   boost circuitry having third transistors that are configured to receive boost control signals, wherein the third transistors generate boost voltages based on the boost control signals and provide the boost voltages to the first transistors of the header circuitry based on the boost control signals.

2. The device of claim 1, wherein the bias generation circuitry is configured to provide the bias voltages so as to avoid stress or reliability issues related to one or more transistors in the device including the first transistors and the second transistors.

3. The device of claim 1, wherein the device comprises a level shifter that operates within a multi-voltage range associated with different voltage levels related to one or more of 1.8V, 2.5V and 3.3V.

4. A device, comprising:
   header circuitry having first transistors configured to receive a supply voltage and provide a dynamically biased voltage;
   reference generation circuitry having multiple amplifiers configured to receive the supply voltage and provide reference voltages based on the supply voltage;
   bias generation circuitry having second transistors configured to track changes in the dynamically biased voltage and adjust the dynamically biased voltage by generating bias voltages based on the reference voltages and by applying the bias voltages to the header circuitry so as to adjust the dynamically biased voltage, wherein the first transistors of the header circuitry have a first stage, and wherein:
      the first stage has cross-coupled transistors coupled between the supply voltage and first stacked transistors, and
      the first stacked transistors are coupled to gates of the cross-coupled transistors and output nodes.

5. The device of claim 4, wherein the first transistors of the header circuitry include a second stage and a third stage, and wherein:
   the second stage has second stacked transistors coupled between the first stage at the output nodes and the bias generation circuitry at intermediate nodes, and
   the third stage has third stacked transistors coupled between the bias generation circuitry at the intermediate nodes and ground.

6. A device, comprising:
   header circuitry having first transistors configured to receive a supply voltage and provide a dynamically biased voltage;

reference generation circuitry having multiple amplifiers configured to receive the supply voltage and provide reference voltages based on the supply voltage;

bias generation circuitry having second transistors configured to track changes in the dynamically biased voltage and adjust the dynamically biased voltage by generating bias voltages based on the reference voltages and by applying the bias voltages to the header circuitry so as to adjust the dynamically biased voltage, wherein the reference generation circuitry includes buffered bandgap circuitry that receives the supply voltage and provides a bandgap voltage based on the supply voltage.

7. The device of claim 6, wherein:

a first amplifier of the multiple amplifiers is configured to receive the bandgap voltage and provide a first reference voltage of the reference voltages, and a second amplifier of the multiple amplifiers is configured to receive the supply voltage, receive the first reference voltage, and provide a second reference voltage of the reference voltages.

8. The device of claim 1, wherein the second transistors of the bias generation circuitry are configured to receive the dynamically biased voltage, receive the reference voltages, and provide stack-bias voltages based on the dynamically biased voltage and the reference voltages.

9. A device, comprising:

header circuitry having first transistors configured to receive a supply voltage and provide a dynamically biased voltage;

reference generation circuitry having multiple amplifiers configured to receive the supply voltage and provide reference voltages based on the supply voltage;

bias generation circuitry having second transistors configured to track changes in the dynamically biased voltage and adjust the dynamically biased voltage by generating bias voltages based on the reference voltages and by applying the bias voltages to the header circuitry so as to adjust the dynamically biased voltage, wherein the second transistors of the bias generation circuitry are configured to receive the dynamically biased voltage, receive the reference voltages, and provide stack-bias voltages based on the dynamically biased voltage and the reference voltages; and bias driver circuitry having fourth transistors that are configured to receive the supply voltage, receive the reference voltages, receive the stack-bias voltages, and provide an output pad voltage to an output pad.

10. An output circuit, comprising:

boost logic configured to provide boost voltages based on boost control signals; header logic configured to derive a dynamically biased voltage from a supply voltage and the boost voltages;

reference logic configured to derive reference voltages from the supply voltage;

bias logic configured to track voltage changes in the dynamically biased voltage, generate bias voltages based on the reference voltages, and apply the bias voltages to the header logic so as to adjust the dynamically biased voltage, and wherein the reference logic has buffered bandgap logic that derives a bandgap voltage based on the supply voltage.

11. The output circuit of claim 10, wherein the bias logic is configured to provide the bias voltages so as to thereby avoid stress or reliability issues related to one or more transistors in the output circuit.

12. The output circuit of claim 10, wherein the output circuit is implemented as a level shifter that operates within a multi-voltage range associated with different voltage levels related to one or more of 1.8V, 2.5V and 3.3V.

13. The output circuit of claim 10, wherein:

the reference logic has a first amplifier configured to derive a first reference voltage of the reference voltages from the bandgap voltage, and the reference logic has a second amplifier configured to derive a second reference voltage of the reference voltages from the supply voltage and the first reference voltage.

14. The output circuit of claim 10, wherein the bias logic is configured to derive stack-bias voltages from the dynamically biased voltage and the reference voltages, and wherein the bias logic is configured to generate bias voltages based on the reference voltages and the stack-bias voltages.

15. A method, comprising:

providing header logic that derives a dynamically biased voltage from a supply voltage;

providing reference logic that derives reference voltages from the supply voltage; and providing bias logic that tracks changes in the dynamically biased voltage, generates bias voltages based on the reference voltages, and applies the bias voltages to the header logic so as to adjust the dynamically biased voltage, wherein the reference logic has buffered bandgap logic that derives a bandgap voltage based on the supply voltage.

16. The method of claim 15, further comprising:

providing boost logic that provides boost voltages based on boost control signals, wherein the header logic derives the dynamically biased voltage from the supply voltage and the boost voltages.

17. The method of claim 15, wherein the bias logic provides the bias voltages so as to avoid stress or reliability issues related to one or more transistors in the header logic, reference logic and bias logic.

18. The method of claim 15, wherein the dynamically biased voltage operates within a multi-voltage range associated with different voltage levels related to one or more of 1.8V, 2.5V and 3.3V.

19. The method of claim 15, wherein:

the reference logic has a first amplifier configured to derive a first reference voltage of the reference voltages from the bandgap voltage, and the reference logic has a second amplifier configured to derive a second reference voltage of the reference voltages from the supply voltage and the first reference voltage.

* * * * *